US006902940B2

(12) United States Patent
Drewes

(10) Patent No.: US 6,902,940 B2
(45) Date of Patent: Jun. 7, 2005

(54) METHOD FOR MANUFACTURE OF MRAM MEMORY ELEMENTS

(75) Inventor: Joel A. Drewes, Boise, ID (US)

(73) Assignee: Micron Technology, Inc., Boise, ID (US)

(*) Notice: Subject to any disclaimer, the term of this patent is extended or adjusted under 35 U.S.C. 154(b) by 65 days.

(21) Appl. No.: 10/644,882

(22) Filed: Aug. 21, 2003

(65) Prior Publication Data

US 2004/0042315 A1 Mar. 4, 2004

Related U.S. Application Data

(62) Division of application No. 10/228,062, filed on Aug. 27, 2002, now Pat. No. 6,677,631.

(51) Int. Cl.$^7$ .............................................. H01L 21/00
(52) U.S. Cl. ................................. 438/3; 438/3; 438/73
(58) Field of Search ................................ 438/3, 73, 77, 438/381; 365/158, 173, 171; 360/324.5

(56) References Cited

U.S. PATENT DOCUMENTS

| 5,764,567 | A |   | 6/1998 | Parkin |
|---|---|---|---|---|
| 5,862,022 | A | * | 1/1999 | Noguchi et al. .......... 360/324.2 |
| 6,438,026 | B2 | * | 8/2002 | Gillies et al. ................ 365/158 |
| 6,466,419 | B1 |   | 10/2002 | Mao |
| 6,777,730 | B2 |   | 8/2004 | Daughton et al. |
| 2002/0030489 | A1 |   | 3/2002 | Lenssen et al. |
| 2002/0141120 | A1 | * | 10/2002 | Gill ......................... 360/324.2 |

* cited by examiner

Primary Examiner—David Nelms
Assistant Examiner—Thinh T Nguyen
(74) Attorney, Agent, or Firm—Dickstein Shapiro Morin & Oshinsky LLP

(57) ABSTRACT

A magnetic memory element has reduced demagnetization coupling between a pinned layer and a free layer. The element includes a pinned ferromagnetic layer and a free ferromagnetic layer which are separated by a barrier layer. The pinned layer is pinned by an antiferromagnetic layer. An offset ferromagnetic layer is provided on a side of the antiferromagnetic layer opposite the pinned ferromagnetic layer to reduce demagnetization coupling between the free ferromagnetic layer and the pinned ferromagnetic layer.

16 Claims, 3 Drawing Sheets

METHOD FOR MANUFACTURE OF MRAM MEMORY ELEMENTS

This application is a divisional of application Ser. No. 10/228,062, filed on Aug. 27, 2002, now U.S. Pat. No. 6,677,631 which is incorporated herein by reference.

BACKGROUND OF THE INVENTION

1. Field of the Invention

The present invention relates to magnetic memory elements, and more specifically, to magnetic tunnel junction structures having reduced demagnetization coupling between pinned and free ferromagnetic layers for use in a magnetic random access memory (MRAM) device.

2. Brief Description of the Related Art

Various types of digital memory are used extensively in digital systems such as microprocessor-based systems, digital processing systems, and the like. Recently, magnetic random access memory (MRAM) devices have been investigated for possible use in non-volatile random access memory. The resistance of such a device changes based on the relative magnetized state of a sense (free) ferromagnetic layer to a pinned ferromagnetic layer. The magnetic moment of the pinned layer remains fixed while the magnetic moment of the free layer can change depending on an applied magnetic field. The relative magnetic direction of the free layer to the pinned layer are referred to as "parallel" and "antiparallel".

Typically, a magnetic memory element, such as a magnetic tunnel junction (MTJ) memory element, has a structure that includes the free and pinned ferromagnetic layers separated by a non-magnetic tunnel junction barrier layer. These magnetic memory elements are formed using thin-film materials.

In response to parallel and antiparallel magnetic states, the magnetic memory element represents two different resistances to a current provided across the memory element in a direction perpendicular to the plane of the ferromagnetic layers. The resistance has minimum and maximum values corresponding to when the magnetization vectors of the free and pinned layers are parallel and antiparallel, respectively. The tunnel barrier layer is sufficiently thin that quantum-mechanical tunneling of charge carriers occurs across the barrier junction between the two separated sets of ferromagnetic layers.

Magnetic memory elements structurally include very thin layers, some of which are tens of angstroms thick. Due to the very thin layers and small size of the element, the magnetic field response of the free layer is affected by magnetic coupling between the free and pinned layers. Consequently, the magnetic vector of the free layer, for example, may preferentially orient in the antiparallel direction. This may destabilize the memory element and also make it more difficult to switch the magnetic vector of the free layer to the parallel direction.

A representative prior art MTJ structure is shown in FIG. 1. The structure includes a free ferromagnetic layer 10 separated from a pinned ferromagnetic layer 12 by a tunnel barrier layer 6. The free and pinned ferromagnetic layers may each be formed as a plurality of stacked individual layers. A seed layer 8 is typically provided below the free ferromagnetic layer 10. Pinned ferromagnetic layer 12 is pinned by an antiferromagnetic pinning layer 14. A cap layer 16 is also typically provided.

A disadvantage of the prior art MTJ structure shown in FIG. 1 is that demagnetizing coupling occurs between pinned layer 12 and free layer 10, as indicated by the curved arrows. As a result, in the absence of an applied external field, the magnetism of free layer 10 will tend to want to orient under the coupling influence of pinned layer 12 in the anti parallel direction. Consequently, the free layer 10 has different magnetic field strength switching thresholds when going from an anti parallel state to a parallel state and vice versa. This produces a magnetic field offset required to switch the free layer 10 from one orientation to the other.

FIG. 2 illustrates another prior art MTJ structure in which a set of pinned ferromagnetic layers 32, 38 are produced by a "synthetic" antiferromagnet in which the two ferromagnetic layers 32 and 38 are separated by an anti-parallel coupling layer 36 made of ruthenium, for example. The coupling layer 36 enhances magnetic coupling between pinned layer 32 and ferromagnetic layer 38 which reduces the undesired magnetic coupling between pinned layer 32 and free layer 30. While helping to demagnetize the free layer 30 from the effects of pinned layer 32, additional layers are required in the memory device as a special anneal process is required.

An MTJ structure having reduced demagnetization coupling between pinned and free layers, without the need for synthetic antiferromagnets, is desirable.

BRIEF SUMMARY OF THE INVENTION

The present invention utilizes an additional ferromagnetic film on top of an antiferromagnetic pinning film to reduce the demagnetization coupling between free and pinned ferromagnetic layers in MRAM devices. A magnetic tunnel junction memory element according to the present invention includes a pinned ferromagnetic layer, a free ferromagnetic layer, and a barrier layer separating the pinned stack from the free stack. The pinned ferromagnetic layer has a pinning antiferromagnetic layer adjacent to it. An offset ferromagnetic layer is further provided on a side of the pinning antiferromagnetic layer opposite the pinned ferromagnetic layer. The offset ferromagnetic layer reduces demagnetization coupling between the free ferromagnetic layer and the pinned ferromagnetic layer.

These and other features and advantages of the invention will be better understood from the following detailed description, which is provided in connection with the accompanying drawings.

DETAILED DESCRIPTION OF THE INVENTION

Figure 1:
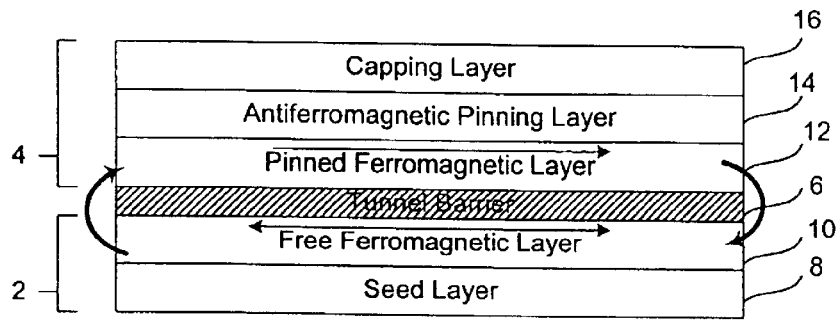
FIG. 1 illustrates a prior art MTJ MRAM memory element.
Figure 2:
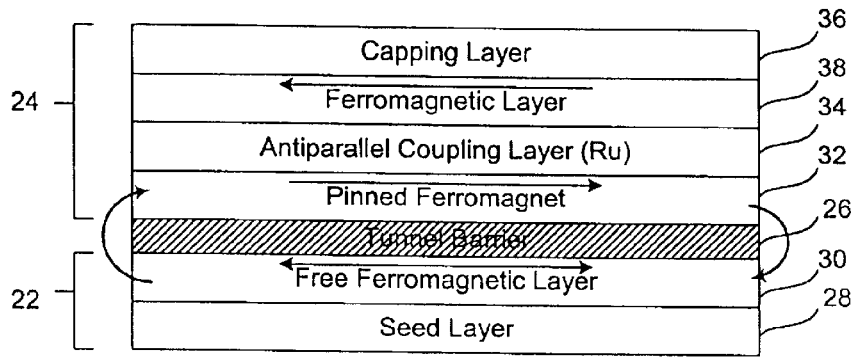
FIG. 2 illustrates another prior art MTJ MRAM memory element which employs synthetic antiferromagnetic structure.
Figure 3:
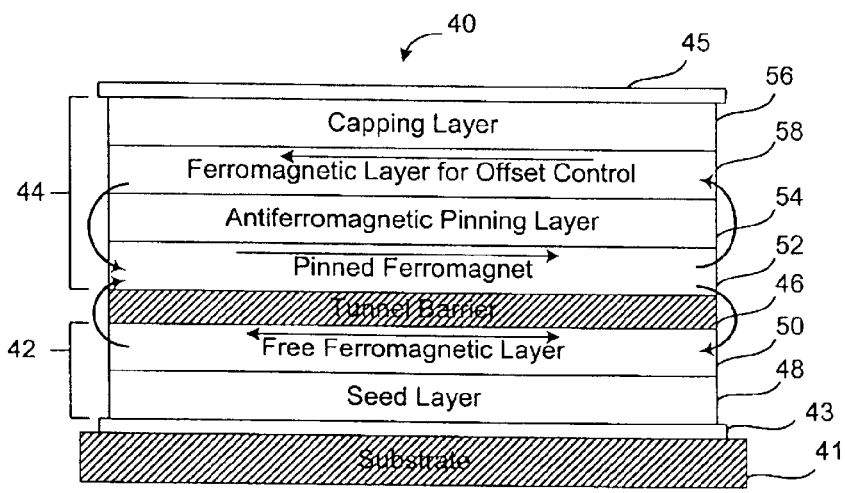
FIG. 3 illustrates an exemplary embodiment of the present invention.

Referring to FIG. 3, a magnetic tunnel junction magnetic memory element 40 according to the present invention is shown. The memory element is formed over a substrate 41 and is fabricated using conventional film fabrication techniques. Memory element 40 includes a free ferromagnetic layer 50 made of a Ni—Fe or Co—Fe compound formed over seed layer 48. Seed layer 48, in turn, is formed over conductive layer 43 which provides an electrical connection to the memory element. A tunnel barrier layer 46, made of $Al_2O_3$, is formed over the free layer 50. A pinned ferromagnetic layer 52, formed also of a Co—Fe or Ni—Fe compound, is provided over tunnel barrier layer 46.

The magnetization direction of pinned ferromagnetic layer 52 is fixed by an antiferromagnetic pinning layer 54 formed over pinned ferromagnetic layer 52. Antiferromagnetic pinning layer 54 is generally formed of iridium manganese (IrMn) or platinum manganese (PtMn).

As noted above, the directional orientation of a magnetic domain of free layer 50 is affected by pinned ferromagnet 52 as a result of undesired demagnetization coupling. The demagnetization coupling is represented in FIG. 3 by curved arrows linking the two layers 50 and 52.

The demagnetization coupling is offset, according to the present invention, by the presence of a ferromagnetic layer 58 formed on top of the antiferromagnetic pinning layer 54. Ferromagnetic layer 58 establishes a magnetic coupling with pinned ferromagnet 52, as indicated by the curved arrows linking the two layers. Accordingly, ferromagnetic layer 58 acts like a magnetic flux vacuum and redirects magnetic flux from layer 52 to layer 58 thereby reducing the magnetic flux coupling between pinned ferromagnetic layer 52 and free ferromagnet layer 50. capping layer 56 is formed over the ferromagnetic layer 58 and a conducted layer may be provided over the capping layer 56 which is electrically coupled to ferromagnetic layer 58. It should be understood that while the memory element of FIG. 3 has been describe as containing various material layers, e.g., 48, 50, 46, 52, 54, 28 and 56, each of those layers may, in fact, be formed of a plurality of thin film layers.

Figure 4:
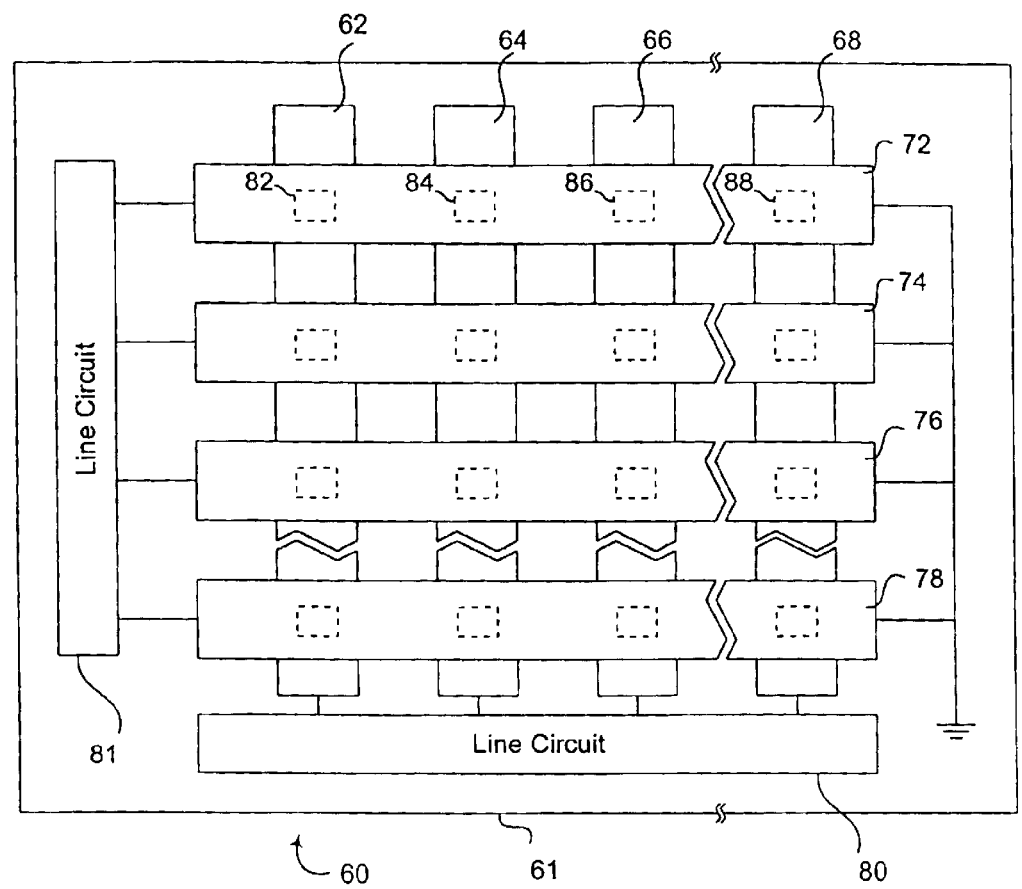
FIG. 4 illustrates a magnetic random access memory according an exemplary embodiment of the present invention.

Referring to FIG. 4, an MRAM array 60 according to a preferred embodiment of the present invention is illustrated. Array 60 is formed over a substrate 61 and includes column lines 62, 64, 66, and 68, and row lines 72, 74, 76, and 78. Columns and rows are selected by column and row line circuits 80 and 81, respectively. At the intersection of each column and row line is an MTJ memory element fabricated in accordance with the invention and designated as 82, 84, 86, and 88.

Figure 5:
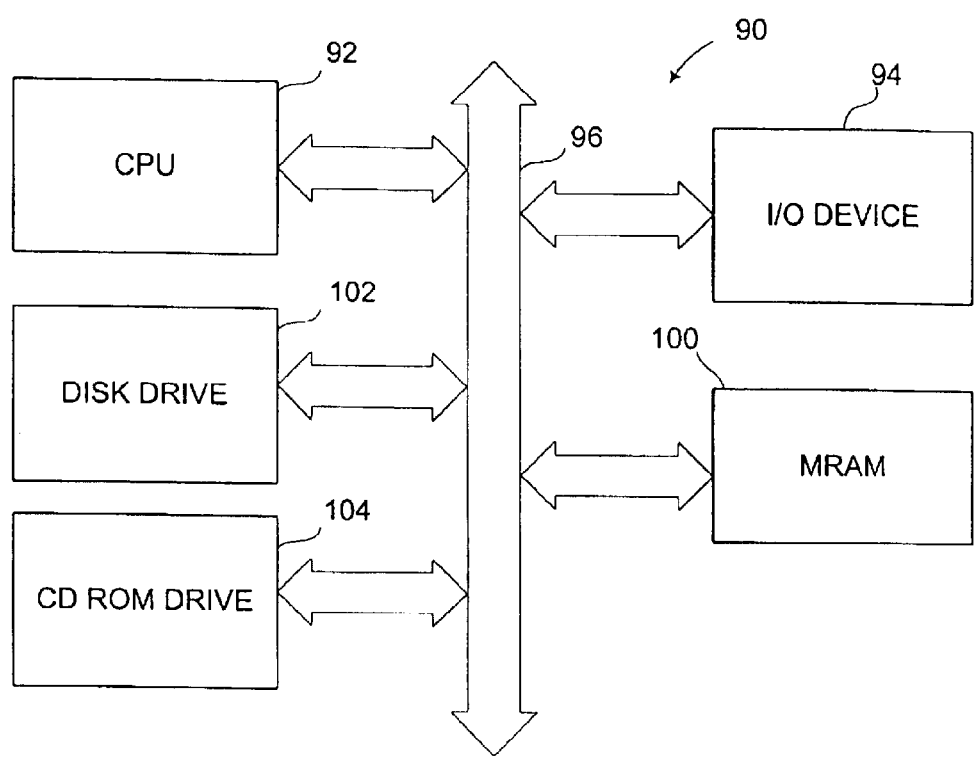
FIG. 5 illustrates a microprocessor-based system that utilizes magnetic memory according to the present invention.

FIG. 5 illustrates a processor system 90 in which an MRAM 100 according to the present invention may be utilized. System 90 includes a CPU 92 and a user input/output (I/O) device 94 connected to a system bus 96. System 90 also includes MRAM 100 which communicates with the CPU 92 over system bus 96. Other peripheral devices include a disk drive 102 and a CD ROM drive 104.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. A method of forming a magnetic tunnel junction element comprising:
   forming a free ferromagnetic layer;
   forming a pinned ferromagnetic layer;
   forming a tunnel junction barrier layer between the free and pinned layers; and
   forming an offset ferromagnetic layer in flux communication with the pinned layer which reduces demagnetization coupling between the pinned ferromagnetic layer and the free ferromagnetic layer,
   wherein the free ferromagnetic layer is arranged to align magnetically in either of two orientations with respect to the pinned ferromagnetic layer for storage of bit data.

2. A method as in claim 1, wherein at least one of free and pinned layers comprises a layer of at least one of Co—Fe and Ni—Fe.

3. A method as in claim 1, further comprising forming conductive layers in electrical contact with the free layer and the offset layer.

4. A method of forming a magnetic memory element comprising:
   forming a free ferromagnetic layer;
   forming a pinned ferromagnetic layer;
   forming a tunnel junction barrier layer between the free and pinned layers;
   forming an antiferromagnetic layer for pinning the pinned layer; and
   forming another ferromagnetic layer on a side of said antiferromagnetic layer which is opposite a side on which said pinned layer is formed, said another ferromagnetic layer receiving flux coupling between said free and pinned layers,
   wherein the free ferromagnetic layer is arranged to align magnetically in either of two orientations with respect to the pinned ferromagnetic layer for storage of bit data.

5. A method as in claim 1, wherein the free ferromagnetic layer is formed such that a magnetic domain of the free layer orients in either a parallel or an antiparallel orientation with respect to a magnetic domain of the pinned layer.

6. A method as in claim 1, wherein the offset ferromagnetic layer and the free antiferromagnetic layer are formed such that a magnetic domain orientation axis of the offset ferromagnetic layer is substantially coplanar with a magnetic domain orientation axis of the free layer.

7. A method as in claim 1, further comprising forming a pinning layer to pin the pinned ferromagnetic layer.

8. A method as in claim 7, wherein the pinned layer is formed adjacent the antiferromagnetic layer.

9. A method as in claim 7, wherein the pinned layer is pinned only by the antiferromagnetic layer.

10. A method as in claim 7, wherein the pinning layer comprises a layer of at least one of IrMn and PtMn.

11. A method as in claim 4, wherein the pinned layer is pinned without a synthetic antiferromagnet.

12. A method as in claim 4, wherein the free layer is arranged such that a magnetic domain of the free layer orients in either a parallel or an antiparallel orientation with respect to a magnetic domain of the pinned layer.

13. A method as in claim 4, wherein the free and the another ferromagnetic layers are arranged such that a magnetic domain orientation axis of the another ferromagnetic layer is substantially coplanar with a magnetic domain orientation axis of the free layer.

14. A method as in claim 4, wherein the pinned layer is arranged adjacent the antiferromagnetic layer.

15. A method as in claim 4, wherein the pinned layer is pinned only by the antiferromagnetic layer.

16. A method as in claim 4, wherein the pinned layer is pinned without a synthetic antiferromagnet.

* * * * *